US007005867B2

(12) United States Patent
Hashimoto

(10) Patent No.: US 7,005,867 B2
(45) Date of Patent: Feb. 28, 2006

(54) POWER SUPPLY CIRCUIT AND TESTING DEVICE

(75) Inventor: Yoshihiro Hashimoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/730,196

(22) Filed: Dec. 5, 2003

(65) Prior Publication Data

US 2004/0113601 A1 Jun. 17, 2004

Related U.S. Application Data

(63) Continuation of application No. PCT/JP02/05607, filed on Jun. 6, 2002.

(30) Foreign Application Priority Data

Jun. 6, 2001 (JP) ............................ 2001-171113

(51) Int. Cl.
*G01R 27/08* (2006.01)
*H02J 3/16* (2006.01)

(52) U.S. Cl. ...................................... 324/713; 323/242

(58) Field of Classification Search ................ 324/713, 324/522, 763, 765; 323/210, 242; 307/125; 327/309
See application file for complete search history.

(56) References Cited

U.S. PATENT DOCUMENTS 4,504,777 A * 3/1985 Bauer ......................... 323/300
4,677,364 A * 6/1987 Williams et al. .............. 322/47
4,752,726 A * 6/1988 Aoyama ..................... 323/207
4,857,821 A * 8/1989 Takeda ....................... 323/210
5,059,889 A * 10/1991 Heaton ....................... 323/285
5,150,072 A * 9/1992 Malec ........................ 330/149
5,608,614 A * 3/1997 Ohnishi et al. ............... 363/60
5,612,609 A * 3/1997 Choi .......................... 323/210
6,531,854 B1 * 3/2003 Hwang ....................... 323/285
6,556,034 B1 * 4/2003 Johnson et al. ............. 324/765
6,717,389 B1 * 4/2004 Johnson ...................... 323/282
2002/0171399 A1 * 11/2002 Kitagawa .................... 320/134

FOREIGN PATENT DOCUMENTS

EP 0 597 426 A2 5/1994
JP 2-280668 11/1990
JP 7-333249 12/1995
JP 2001-69749 3/2001
JP 2001-108725 4/2001
JP 2001-124821 5/2001

OTHER PUBLICATIONS

Patent Abstracts of Japan; Publication No. 07-333249 dated Dec. 22, 1995, 1 pg.
Patent Abstracts of Japan; Publication No. 2001-069749 dated Mar. 16, 2001, 1 pg.
Patent Abstracts of Japan; Publication No. 02-280668 dated Nov. 16, 1990, 1 pg.

(Continued)

*Primary Examiner*—Anjan Deb
(74) *Attorney, Agent, or Firm*—Osha Liang LLP

(57) ABSTRACT

A power supply circuit is provided that supplies a voltage to a load. The power supply circuit includes a power supply for generating a predetermined voltage; an electrical path for electrically connecting the power supply and the load to each other; a current draw unit for drawing a current from the electrical path; and a current control unit for controlling the current drawn by the current draw unit from the electrical path.

18 Claims, 3 Drawing Sheets

OTHER PUBLICATIONS

Patent Abstracts of Japan; Publication No. 2001-124821 dated May 11, 2001, 1 pg.
Patent Abstracts of Japan; Publication No. 2001-108725 dated Apr. 20, 2001, 1 pg.
International Search Report mailed Sep. 24, 2002 in International Application No. PCT/JP02/05607.
English Translation of Korean Office Action dated Oct. 21, 2005 (2 pages).

* cited by examiner

FIG. 3A
FIG. 3B
FIG. 3C
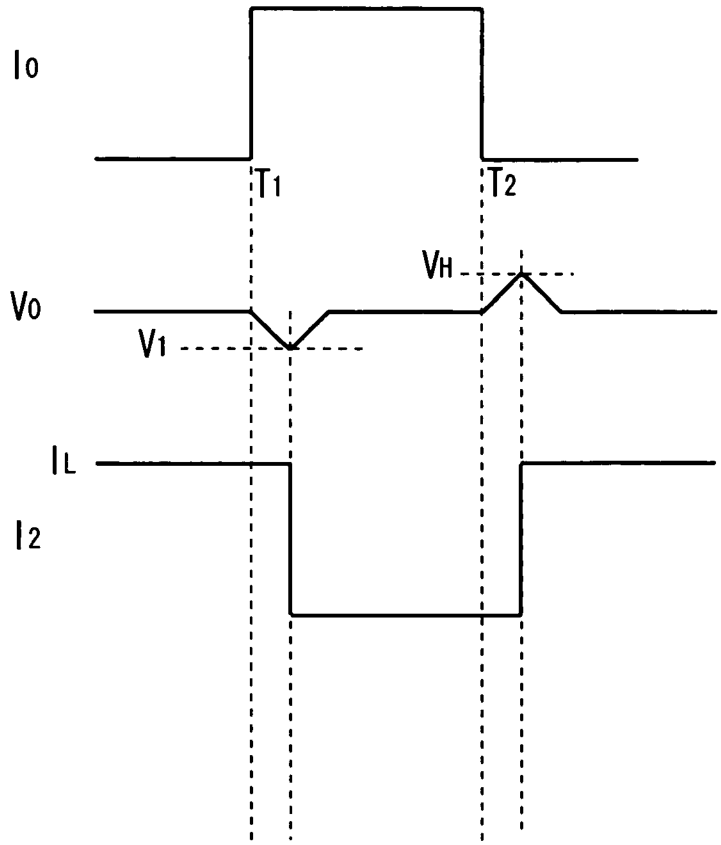
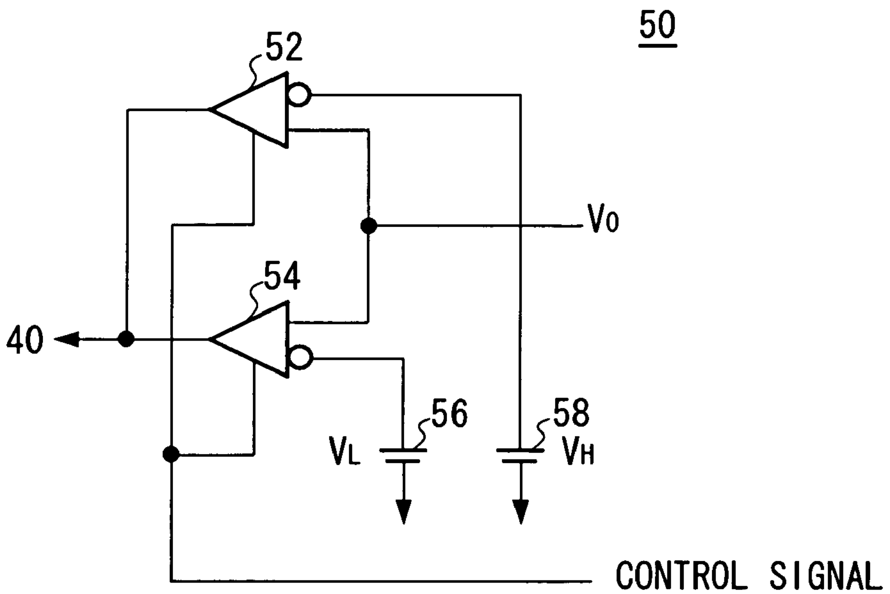
FIG. 4

POWER SUPPLY CIRCUIT AND TESTING DEVICE

The present application is a continuation application of PCT/JP02/05607 filed on Jun. 6, 2002 which claims priority from a Japanese Patent Application No. 2001-171113 filed on Jun. 6, 2001, the contents of which is incorporated herein by reference.

BACKGROUND OF THE INVENTION

1. Field of the Invention

The present invention relates to a power supply circuit for supplying a voltage and a testing device for testing an electronic device. More particularly, the present invention relates to a power supply circuit for supplying a constant voltage.

2. Description of Related Art

A conventional testing device for testing a semiconductor memory or the like uses a voltage generation circuit for supplying a constant voltage to the semiconductor memory as a power supply for driving the semiconductor memory, in order to prevent damage or the like of the semiconductor memory. As a device for supplying a constant voltage to a load, a voltage generation circuit disclosed in Japanese Patent Application Laying-Open No. 7-333249 is presently known, for example. This voltage generation circuit increases and reduces a current drawn from a supply line for supplying the voltage to the load based on increase and decrease of a current flowing through the supply line.

In order to achieve a high-speed operation of the conventional constant voltage generation circuit, however, an analog circuit such as a high-performance subtracter circuit is required. Moreover, there was a disadvantage that the circuit scale became larger, for example. In addition, the operation was delayed in some cases, because the current was controlled after the current actually had started to flow through a resistor.

SUMMARY OF THE INVENTION

Therefore, it is an object of the present invention to provide a power supply circuit and a testing device, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, a power supply circuit for supplying a voltage to a load is provided that comprises: a power supply operable to generate a predetermined voltage; an electrical path operable to electrically connect the power supply and the load to each other; a current draw unit operable to draw a current from the electrical path; and a current control unit operable to control the current drawn by the current draw unit from the electrical path based on a voltage received by the load.

The current draw unit may connect to the electrical path to be in parallel to the load. The power supply circuit may further comprise a first current change unit, provided in the electrical path between the current draw unit and the load to be in parallel to the load, operable to supply a current to the electrical path in a case where a current received by the load increased and draw a current from the electrical path in a case where the current received by the load decreased. The first current change unit may be a capacitor.

An inductance component of the electrical path between the power supply and the current draw unit may be larger than an inductance component of the electrical path between the current draw unit and the load. The current control unit may make the current drawn by the current draw unit from the electrical path substantially zero in a case where the voltage received by the load became lower than a predetermined voltage. The current control unit may make the current drawn by the current draw unit from the electrical path to be a predetermined current value in a case where the voltage received by the load became higher than a predetermined voltage. The power supply circuit may further comprise a second current change unit, provided in the electrical path between the power supply and the current draw unit to be in parallel to the current draw unit, operable to supply a current to the electrical path in a case where the current drawn by the current draw unit increased and draw a current from the electrical path in a case where the current drawn by the current draw unit decreased. The second current change unit may be a capacitor.

The capacitor serving as the second current change unit may have a larger capacity than the capacitor serving as the first current change unit. The electrical path may include: a first coil arranged between the power supply and the current draw unit; and a second coil arranged between the current draw unit and the load, the second coil having a smaller inductance than the first coil.

The current draw unit may include a MOS-FET. A drain terminal of the MOS-FET may be connected to the electrical path, while a source terminal thereof maybe grounded. The power supply circuit may further comprise a driving unit operable to drive the MOS-FET in a saturation current region. The power supply circuit may further comprise a unit operable to apply a voltage to a gate terminal of the MOS-FET based on a drain voltage at the drain terminal of the MOS-FET.

According to the second aspect of the present invention, a testing device for testing an electronic device is provided that comprises: a pattern generator operable to generate a test pattern for testing the electronic device; a determination unit operable to determine whether the electronic device is defective or not based on an output signal the electronic device outputs based on the test pattern; and a power supply circuit operable to supply power for driving the electronic device to the electronic device, wherein the power supply circuit includes: a power supply operable to generate a predetermined voltage; an electrical path operable to electrically connect the power supply and the electronic device to each other; a current draw unit operable to draw a current from the electrical path; and a current control unit operable to control the current drawn by the current draw unit from the electrical path based on a voltage received by the electronic device.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF DRAWINGS

FIGS. 3A, 3B and 3C explain an operation of the power supply circuit 30 in a case where a current supplied to an electronic device 12 changed.

FIG. 4 shows an exemplary structure of a current control unit 50.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
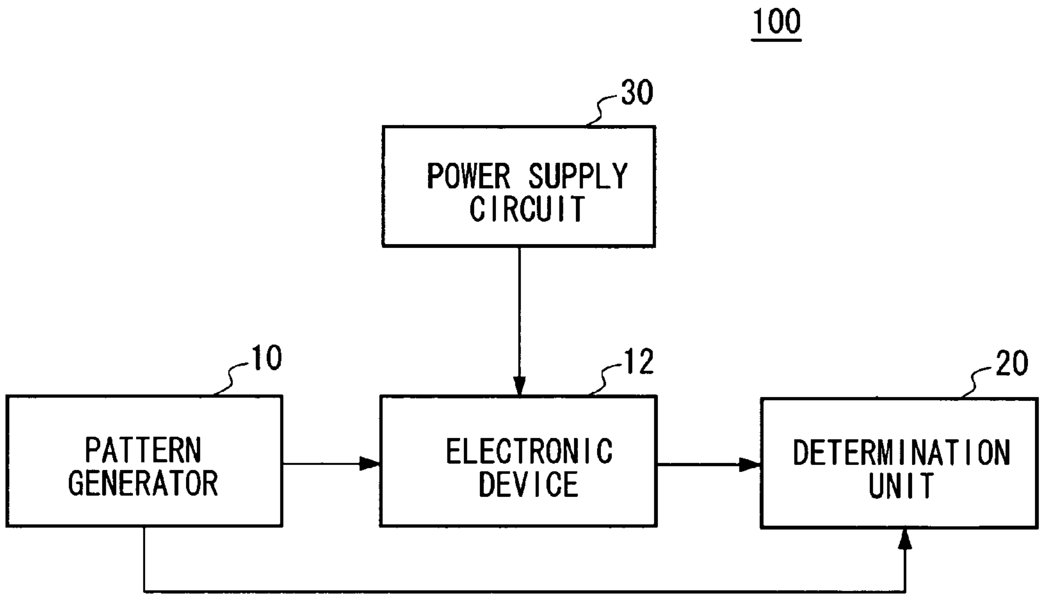
FIG. 1 shows an exemplary structure of a testing device 100 according to the present invention.

FIG. 1 shows an exemplary structure of a testing device 100 according to the present invention. The testing device 100 includes a pattern generator 10, a power supply circuit 30 and a determination unit 20. In the present invention, an electronic device 12 under test may include a digital circuit containing a plurality of semiconductor devices or may include a circuit in which a digital part and an analog part are mixed. For example, the electronic device 12 may be a semiconductor memory.

The pattern generator 10 generates a test pattern for testing the electronic device 12 and supplies it to the electronic device 12. It is preferable that the pattern generator 10 generate various test patterns in accordance with items of the test for the electronic device 12. For example, it is preferable that the pattern generator 10 supply a test pattern that causes all the semiconductor devices in the electronic device 12 at least once to the electronic device 12. In a case where the electronic device 12 is a semiconductor memory, for example, the pattern generator 10 supplies a test pattern for testing whether or not a writing operation can be performed normally for all addresses in the semiconductor memory, to the electronic device 12.

The power supply circuit 30 supplies power for driving the electronic device 12 to the electronic device 12. The power supply circuit 30 supplies an approximately constant voltage to the electronic device 12. Because the power supply circuit 30 supplies the approximately constant voltage to the electronic device 12, it is possible to test the electronic device 12 without damaging it, even in a case a current that is supplied to the electronic device 12 rapidly changes.

The determination unit 20 determines whether or not the electronic device 12 is defective based on an output signal the electronic device 12 outputs based on the test pattern. For example, the pattern generator 10 may generate an expected-value signal that is a signal to be output by the electronic device 12 based on the test pattern, while the determination unit 20 may compare the expected-value signal with the output signal so as to determine whether or not the electronic device 12 is defective. Moreover, in a case where the electronic device 12 is a semiconductor memory, the determination unit 20 may determine whether or not the electronic device 12 is defective based on whether or not a predetermined signal has been stored at a predetermined address in the electronic device 12. In this case, the determination unit 20 preferably includes a unit for reading the signal stored at the predetermined address in the electronic device 12.

Figure 2:
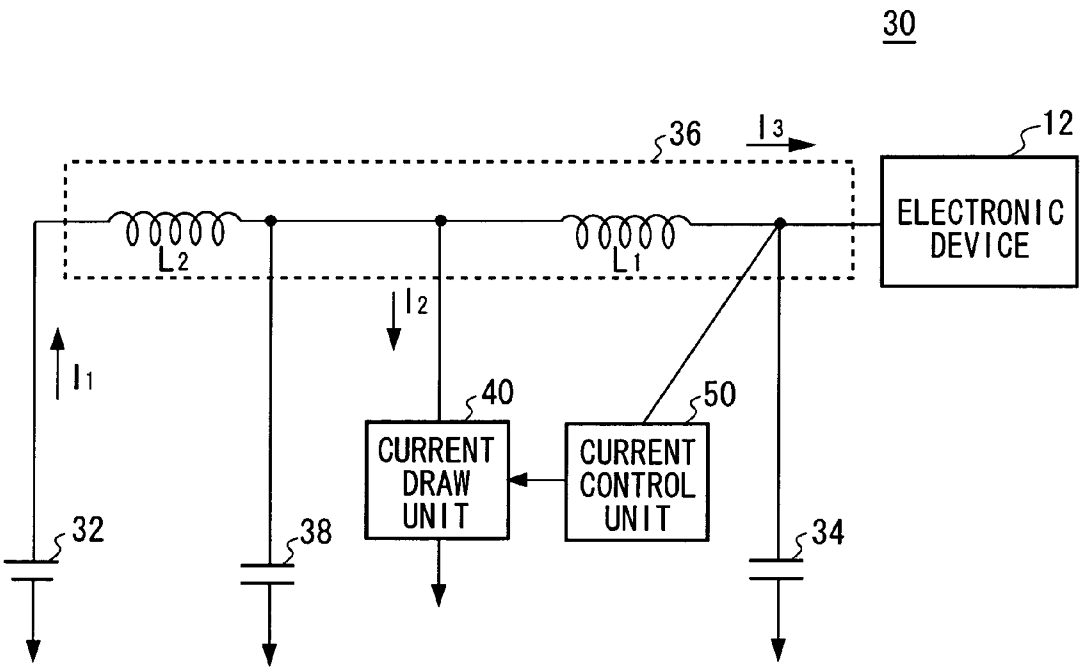
FIG. 2 shows an exemplary structure of a power supply circuit 30.

FIG. 2 shows an exemplary structure of the power supply circuit 30. The power supply circuit 30 supplies a voltage to the electronic device 12 serving as a load. The power supply circuit 30 includes a power supply 32, an electrical path 36, a current draw unit 40, a current control unit 50, the first current change unit 34 and the second current change unit 38. The power supply 32 generates a predetermined voltage. As shown in FIG. 2, the power supply 32 can be a DC power supply.

The electrical path 36 electrically connects the power supply 32 and the electronic device 12 to each other. The current draw unit 40 draws a current from the electrical path 36. For example, in a case where the power supply 32 generates a current $I_1$ and the current draw unit 40 draws a current $I_2$, a current $I_3$ that is supplied to the load is determined by $I_3=I_1-I_2$. As shown in FIG. 2, the current draw unit 40 connects to the electrical path 36 to be in parallel to the electronic device 12. The current draw unit 40 draws a current from the electrical path 36 and outputs the drawn current to reference potential.

The current control unit 50 controls the current drawn by the current draw unit 40 from the electrical path 36 based on the voltage received by the electronic device 12. For example, the current draw unit 40 may make the current drawn by the current draw unit 40 from the electrical path 36 substantially zero in a case where the voltage received by the electronic device 12 became lower than a predetermined voltage. Moreover, the current draw unit 40 may make the current drawn by the current draw unit 40 from the electrical path 36 a predetermined value in a case where the voltage received by the electronic device 12 became higher than a predetermined voltage.

The first current change unit 34 connects to the electrical path 36 between the current draw unit 40 and the electronic device 12 so as to be in parallel to the electronic device 12. The first current change unit 34 supplies a current to the electrical path 36 in a case where the current received by the electronic device 12 increased and draws a current from the electrical path 36 in a case where the current received by the electronic device 12 decreased. The first current change unit 34 may be a capacitor. As shown in FIG. 2, one end of the first current change unit 34 connects to the reference potential.

The second current change unit 38 connects to the electrical path 36 between the power supply 32 and the current draw unit 40 so as to be in parallel to the current draw unit 40. The second current change unit 38 supplies a current to the electrical path 36 in a case where the current drawn by the current draw unit 40 increased and draws a current from the electrical path 36 in a case where the current drawn by the current draw unit 40 decreased. The second current change unit 38 may be a capacitor. As shown in FIG. 2, one end of the second current change unit 38 connects to the reference potential. It is preferable that the capacitor serving as the second current change unit 38 have a larger capacity than the capacitor serving as the first current change unit 34.

The electrical path 36 includes inductance components between the power supply 32 and the electronic device 12. It is preferable that the inductance component $L_2$ in the electrical path 36 between the power supply 32 and the current draw unit 40 be larger than the inductance component $L_1$ in the electrical path 36 between the current draw unit 40 and the electronic device 12. For example, in a case where almost all inductance components in the electrical path 36 are formed by inductance components in a wiring, it is preferable that the current draw unit 40 connect to the electrical path 36 at a portion close to the electronic device 12. That is, it is preferable that the length of the electrical path 36 between the power supply 32 and the current draw unit 40 be longer than the length of the electrical path 36 between the current draw unit 40 and the electronic device 12. For example, the length of the electrical path 36 between the power supply 32 and the current draw unit 40 may be three times longer than the length of the electrical path 36 between the current draw unit 40 and the electronic device 12 or more.

The electrical path 36 may include the first coil arranged between the power supply 32 and the current draw unit 40 and the second coil arranged between the current draw unit 40 and the electronic device 12, the second coil having a smaller inductance than the first coil. In other words, the inductance in the electrical path 36 may be adjusted by the first and second coils. Next, the operation of the power supply circuit 30 is described.

FIGS. 3A, 3B and 3C explain the operation of the power supply circuit 30 in a case where the current that is supplied to the electronic device 12 changed. FIG. 3A shows a current $I_O$ that is supplied to the electronic device 12. In FIG. 3A, the horizontal axis represents time, while the vertical axis represents the intensity of current. FIG. 3B shows change of the voltage received by the electronic device 12, i.e., a voltage $V_O$ at a connection of the first current change unit 34 and the electrical path 36. In FIG. 3B, the horizontal axis represents the same time in FIG. 3A, while the vertical axis represents the intensity of voltage. FIG. 3C shows change of the current $I_2$ drawn by the current draw unit 40. In FIG. 3C, the horizontal axis represents the same time in FIG. 3A, while the vertical axis represents the intensity of current. As shown in FIG. 3C, the current draw unit 40 draws a predetermined current $I_L$ from the electrical path 36 at a stationary state.

As shown in FIG. 3A, when the current $I_O$ increased at a time $T_1$, change of current in the power supply 32, the second current change unit 38 and the current draw unit 40 is delayed because of the inductance component in the electrical path 36. Thus, the first current change unit 34 first supplies a current corresponding to the increase of the current $I_O$ to the electrical path 36. In this example, the capacitor serving as the first current change unit 34 supplies the current corresponding to the increase of the current $I_O$ to the electrical path 36. Therefore, electric charges stored in the capacitor are reduced, thus making the voltage $V_O$ lower, as shown in FIG. 3B.

The current control unit 50 makes the current $I_2$ drawn by the current draw unit 40 substantially zero in a case where the voltage $V_O$ became lower than a predetermined voltage $V_L$. The current $I_L$ drawn by the current draw unit 40 is supplied to the capacitor serving as the first current change unit 34 and the electronic device 12, thus charging the capacitor. As a result, the voltage $V_O$ becomes a stationary value.

Then, when the current $I_O$ decreased at a time $T_2$, as shown in FIG. 3A, the change of current in the power supply 32, the second current change unit 38 and the current draw unit 40 is delayed because of the inductance component in the electrical path 36. Thus, the first current change unit 34 first draws a current corresponding to the decrease of the current $I_O$ from the electrical path 36. In this example, the capacitor serving as the first current change unit 34 draws the current corresponding to the decrease of the current $I_O$ from the electrical path 36. Therefore, the electric charges stored in the capacitor are increased, thus making the voltage $V_O$ higher, as shown in FIG. 3B.

The current control unit 50 controls the current $I_2$ drawn by the current draw unit 40 to be a stationary value $I_L$ in a case where the voltage $V_O$ became higher than a predetermined voltage $V_H$. The charges stored in the capacitor flow to the current draw unit 40 so as to make the voltage $V_O$ the stationary value.

In this example, the current control unit 50 controls the current drawn by the current draw unit 40 to be either zero or the stationary value $I_L$ However, in an alternative example, the current control unit 50 may gradually change the current drawn by the current draw unit 40 based on the voltage $V_O$ received by the electronic device 12.

According to the power supply circuit 30 described above, it is possible to precisely supply an approximately constant voltage to the electronic device 12 without being affected by the delay caused by the inductance component between the power supply 32 and the current draw unit 40 in a case where the current received by the electronic device 12 changed. Moreover, it is not necessary to use a voltage supply driven at a higher speed as the power supply 32. By making the inductance component $L_1$ in the electrical path 36 sufficiently small, it is possible to control the voltage received by the electronic device 12 to be approximately constant, even if the distance between the power supply 32 and the electronic device 12 is large. Since the current draw unit 40 can be formed on a smaller scale than the power supply 32 typically, it is easy to arrange the current draw unit 40 at a position close to the electronic device 12, thus the inductance component $L_1$ can be made small. Therefore, in a case where the test for the electronic device 12 is performed using a high-capacity power supply as the power supply 32, the power supply 32 can be arranged at a position away from the electronic device 12 by a sufficient distance. This enables the test for the electronic device 12 to be precisely performed with no effect of heat, noise and the like generated by the power supply 32.

FIG. 4 shows an exemplary structure of the current control unit 50. The current control unit 50 includes comparators 52 and 54 in this example. The comparator 52 determines whether or not the voltage $V_O$ received by the electronic device 12 is higher than a predetermined voltage $V_H$. For example, the comparator 52 may subtract the voltage $V_H$ from the voltage $V_O$, as shown in FIG. 4. In a typical example, the current control unit 50 makes the current drawn by the current draw unit 40 a predetermined current $I_L$ in a case where the result of the calculation by the comparator 52 is a positive value.

It is preferable that the comparators 52 and 54 include hysteresis functions in order to make the operations thereof stable. The hysteresis function mentioned above means a function for preventing the comparator 52 or 54 from being turned on until a predetermined voltage difference is supplied to the comparator 52 or 54 once the comparator 52 or 54 was turned off.

The comparator 54 determines whether or not the voltage $V_O$ received by the electronic device 12 is lower than a predetermined voltage $V_L$. For example, the comparator 54 may subtract the voltage $V_L$ from the voltage $V_O$, as shown in FIG. 4. In a typical example, in a case where the calculation result in the comparator 54 is a negative value, the current control unit 50 makes the current drawn by the current draw unit 40 approximately zero.

As shown in FIG. 4, the current control unit 50 may include voltage supplies 56 and 58 for supplying predetermined voltages to the comparators 52 and 54, respectively. Moreover, although the comparators 52 and 54 compare the predetermined voltages $V_H$ and $V_L$ with the voltage $V_O$ received by the electronic device 12, respectively, in this example, they may compare a voltage at a connection of the second current change unit 38 and the electrical path 36 with the voltage $V_O$ received by the electronic device 12. For example, the comparator 52 may compare the voltage $V_O$ received by the electronic device 12 with a value obtained by adding a predetermined value to the voltage at the connection of the second current change unit 38 and the electrical path 36. Also, the comparator 54 may compare the voltage $V_O$ received by the electronic device 12 with a value obtained by subtracting a predetermined value from the voltage at the connection of the second current change unit 38 and the electrical path 36.

The power supply circuit 30 may include a unit for inputting a control signal that controls whether to operate the comparators 52 and 54 or not. The power supply circuit 30 may control whether to control the voltage supplied to the electronic device 12 to be constant or not by controlling whether or not the comparators 52 and 54 are allowed to operate. For example, the power supply circuit 30 may switch whether to control the voltage to be supplied to the electronic device 12 to be constant or not in a case where the testing device 100 switches the test for the electronic device 12 between tests of static characteristics test and dynamic characteristics. For example, in a case of performing a test in which change of the voltage received by the electronic device 12 is small, the current control unit 50 may makes the current drawn by the current draw unit 40 approximately zero. It is possible to improve power efficiency of the power supply circuit 30 by inputting the control signal so as to control the current drawn by the current draw unit 40 to be approximately zero in a case where the change of the voltage received by the electronic device 12 is small and to control the voltage received by the electronic device 12 to be approximately constant in a case where the change of the voltage received by the electronic device 12 is large.

Figure 5:
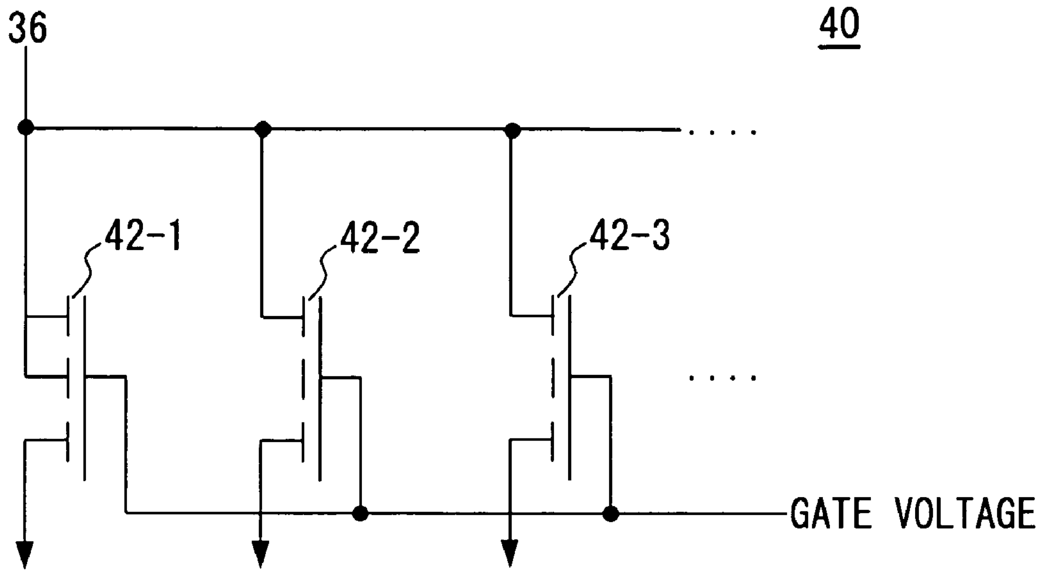
FIG. 5 shows an exemplary structure of a current draw unit 40.

FIG. 5 shows an exemplary structure of the current draw unit 40. The current draw unit 40 may include one or more MOS-FETs 42. In this example, a case is described where the current draw unit 40 includes a plurality of MOS-FETs 42-1, . . . , **42-*n*** (n represents integer).

Drain terminals of the MOS-FETs 42-1, . . . , **42-*n* are connected to the electrical path 36, while source terminals thereof are connected to the reference potential, i.e., are grounded. The current control unit 50 (see FIG. 4) may control the current drawn by the current draw unit 40 by controlling a gate voltage applied to a gate terminal of each MOS-FET 42. Moreover, in a case where the current draw unit 40 draws a predetermined current, the current control unit 50 may control the gate voltage of the MOS-FET 42 in such a manner that the MOS-FET 42 is driven in a saturation current region. For example, the current control unit 50 may apply a voltage to the gate terminal of the MOS-FET 42 based on a drain voltage at the drain terminal, i.e., a voltage at the connection of the current draw unit 40 and the electrical path 36 (see FIG. 2**).

In a case where a range in which the voltage at the drain terminal of the MOS-FET 42 changes is known, the current control unit 50 can drive the MOS-FET 42 in the saturation current region by making the gate voltage a voltage corresponding to the change range of the voltage at the drain terminal. Based on the test pattern for the electronic device 12, it is possible to easily estimate the change range of the voltage at the connection of the current draw unit 40 and the electrical path 36. By driving the MOS-FET 42 in the saturation current region, it is possible to precisely control the amount of the current drawn by the current draw unit 40. Moreover, by connecting a plurality of MOS-FETs 42 in a plurality of stages, the current draw unit 40 can draw a given current.

Although the present invention has been described by way of exemplary embodiments, it should be understood that those skilled in the art might make many changes and substitutions without departing from the spirit and the scope of the present invention which is defined only by the appended claims.

As is apparent from the above description, according to the present invention, it is possible to perform high-speed control for a load voltage even in a case where a load current has changed. Thus, a test for an electronic device can be performed with high precision and damages of the electronic device in the test can be prevented.

What is claimed is:

1. A power supply circuit for supplying a voltage to a load, comprising:

a power supply operable to supply a predetermined DC voltage to the load;

an electrical path operable to electrically connect said power supply and said load to each other;

a current draw unit operable to draw a current from said electrical path; and a current control unit operable to control the current drawn by said current draw unit from said electrical path to decrease the difference between said DC voltage and a voltage received by said load, wherein said current control unit controls the drawn current when the voltage supplied to the load varies to be higher or lower than a predetermined voltage value.

2. A power supply circuit as claimed in claim 1, wherein said current draw unit connects to said electrical path to be in parallel to said load.

3. A power supply circuit as claimed in claim 2, wherein an inductance component of said electrical path between said power supply and said current draw unit is larger than an inductance component of said electrical path between said current draw unit and said load.

4. A power supply circuit as claimed in claim 1, wherein said current control unit makes the current drawn by said current draw unit from said electrical path substantially zero in a case where the voltage received by said load became lower than a predetermined voltage.

5. A power supply circuit as claimed in claim 1, wherein said current control unit makes the current drawn by said current draw unit from said electrical path to be a predetermined current value in a case where the voltage received by said load became higher than a predetermined voltage.

6. A power supply circuit as claimed in claim 1, wherein said electrical path includes: a first coil arranged between said power supply and said current draw unit; and a second coil arranged between said current draw unit and said load, said second coil having a smaller inductance than said first coil.

7. A power supply circuit as claimed in claim 1, wherein said current draw unit includes a MOS-FET.

8. A power supply circuit as claimed in claim 7, wherein a drain terminal of said MOS-FET is connected to said electrical path, while a source terminal thereof is grounded.

9. A power supply circuit as claimed in claim 8, further comprising a driving unit operable to drive said MOS-FET in a saturation current region.

10. A power supply circuit as claimed in claim 9, further comprising a unit operable to apply a voltage to a gate terminal of said MOS-FET based on a drain voltage at said drain terminal of said MOS-FET.

11. A power supply circuit for supplying a voltage to a load, comprising:

a power supply operable to supply a predetermined DC voltage to the load;

an electrical path operable to electrically connect said power supply and said load to each other;

a current draw unit operable to draw a current from said electrical path, wherein said draw unit connects to said electrical path to be in parallel to said load;

a current control unit operable to control the current drawn by said current draw unit from said electrical path to decrease the difference between said DC voltage and a voltage received by said load; and a first current change unit, provided in said electrical path between said current draw unit and said load to be in parallel to said load, operable to supply a current to said electrical path in a case where a current received by said load increased and draw a current from said electrical path in a case where the current received by said load decreased.

12. A power supply circuit as claimed in claim 11, wherein said first current change unit is a capacitor.

13. A power supply circuit for supplying a voltage to a load, comprising:

a power supply operable to supply a predetermined DC voltage to the load;

an electrical path operable to electrically connect said power supply and said load to each other;

a current draw unit operable to draw a current from said electrical path;

a current control unit operable to control the current drawn by said current draw unit from said electrical path to decrease the difference between said DC voltage and a voltage received by said load; and a second current change unit, provided in said electrical path between said power supply and said current draw unit to be in parallel to said current draw unit, operable to supply a current to said electrical path in a case where the current drawn by said current draw unit increased and draw a current from said electrical path in a case where the current drawn by said current draw unit decreased.

14. A power supply circuit as claimed in claim 13, wherein said second current change unit is a capacitor.

15. A power supply circuit as claimed in claim 14, wherein said capacitor serving as said second current change unit has a larger capacity than a capacitor serving as a first current change unit.

16. A testing device for testing an electronic device, comprising:

a pattern generator operable to generate a test pattern for testing said electronic device;

a determination unit operable to determine whether said electronic device is defective or not based on an output signal said electronic device outputs based on said test pattern; and a power supply circuit operable to supply power for driving said electronic device to said electronic device, wherein said power supply circuit includes:

a power supply operable to supply a predetermined DC voltage to the load;

an electrical path operable to electrically connect said power supply and said load to each other;

a current draw unit operable to draw a current from said electrical path; and a current control unit operable to control the current drawn by said current draw unit from said electrical path to decrease a difference between said DC voltage and a voltage received by said load, wherein said current control unit controls the drawn current when the voltage supplied to the load varies to be higher or lower than a predetermined voltage value.

17. A power supply circuit for supplying a voltage to a load, comprising:

a power supply operable to supply a predetermined DC voltage to the load;

an electrical path operable to electrically connect said power supply and said load to each other;

a current draw unit operable to draw a current from said electrical path; and a current control unit operable to control the current drawn by said current draw unit from said electrical path to decrease the difference between said DC voltage and a voltage received by said load, wherein said current control unit controls the drawn current when the power supply is on or off.

18. A testing device for testing an electronic device, comprising:

a pattern generator operable to generate a test pattern for testing said electronic device;

a determination unit operable to determine whether said electronic device is defective or not based on an output signal said electronic device outputs based on said test pattern; and a power supply circuit operable to supply power for driving said electronic device to said electronic device, wherein said power supply circuit includes:

a power supply operable to supply a predetermined DC voltage to the load;

an electrical path operable to electrically connect said power supply and said load to each other;

a current draw unit operable to draw a current from said electrical path; and a current control unit operable to control the current drawn by said current draw unit from said electrical path to decrease a difference between said DC voltage and a voltage received by said load, wherein said current control unit controls the drawn current when the power supply is on or off.

* * * * *